(12) United States Patent (10) Patent No.: US 9,163,954 B2
Cheong et al. (45) Date of Patent: Oct. 20, 2015

(54) LEAKAGE CURRENT COMPENSATION CIRCUIT

(75) Inventors: Chee Weng Cheong, Singapore (SG); Yannick Guedon, Mimosa Park (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 803 days.

(21) Appl. No.: 13/339,715

(22) Filed: Dec. 29, 2011

(65) Prior Publication Data

US 2013/0169295 A1 Jul. 4, 2013

(51) Int. Cl.
*G01R 27/26* (2006.01)
*G01D 3/036* (2006.01)
*G06F 3/044* (2006.01)
*G01D 5/24* (2006.01)

(52) U.S. Cl.
CPC .................. *G01D 3/036* (2013.01); *G01D 5/24* (2013.01); *G01R 27/2605* (2013.01); *G06F 3/044* (2013.01); *H03K 2217/960705* (2013.01)

(58) Field of Classification Search
CPC .. G01R 27/2605; G01R 27/26; G01R 31/025; G01D 5/24
USPC .......................................... 324/684, 685, 686
See application file for complete search history.

(56) References Cited

U.S. PATENT DOCUMENTS

| 6,556,408 | B1 | 4/2003 | Zhang | |
| 6,593,818 | B2 * | 7/2003 | Vanselow et al. | 331/17 |
| 2003/0048830 | A1 * | 3/2003 | Dickerman et al. | 374/103 |
| 2003/0184359 | A1 * | 10/2003 | Gammie et al. | 327/379 |

* cited by examiner

*Primary Examiner* — Amy He
(74) *Attorney, Agent, or Firm* — Gardere Wynne Sewell LLP

(57) ABSTRACT

Circuitry is described for compensating leakage currents in capacitive sensing circuits. A single active leakage compensation circuit may sense a representative leakage current and drive a plurality of output transistors, each of which provides a compensating current to a respective capacitive sensing circuit. The leakage compensation circuit may sense current flow through a device substantially equivalent to a device exhibiting leakage current in a capacitive sensing circuit, and in response, provide a signal to drive one or more output transistors to supply approximately equivalent currents to a plurality of circuit nodes. For embodiments having multiple similar capacitive sensors and capacitive sensing circuits, only one transistor need be added to each capacitive sensing circuit to compensate for leakage current.

28 Claims, 4 Drawing Sheets

LEAKAGE CURRENT COMPENSATION CIRCUIT

BACKGROUND

1. Technical Field

The invention relates to apparatus and methods for detecting and compensating leakage currents in capacitive sensing circuits.

2. Discussion of the Related Art

Capacitive sensing elements have found wide use present day consumer electronics. For example, capacitive sensing elements may be incorporated in touch-sensitive user interfaces for various electronic devices such as computers, tablets, personal digital assistants, video gaming devices, and cellular phones. Capacitive sensing circuits may be used to sense changes in capacitance of a capacitive sensing element due to some type of perturbation, e.g., when an object such as a human finger is brought near the capacitive element. Some capacitive sensing circuits are used in commercial devices to enable device control or device operation via a touch-sensitive user interface. Capacitive sensing circuits may find applications in simple on/off touch pads, touch-sensitive operation panels, touch-sensitive track pads for computer operation, and touch-sensitive screens. Touch-sensitive components can provide a convenient user interface for microprocessor-based devices and may obviate the need for more cumbersome buttons or keyboards in some applications.

One example of a capacitive sensing circuit is shown in FIG. 1. The circuit shown is configured to sense or detect a change in a current $I_{in}$ that flows to or from the capacitive sensing element 110 as a result of a change in capacitance $C_1$ of the capacitive element. There may be a small potential applied to one node of capacitive element 110. Capacitive element 110 may be two plates of a capacitive sensor that is configured to be touched, or nearly touched, by a human finger or some device. Unperturbed, the two plates may exhibit a capacitance $C_1$. As a finger or some other conductive object approaches the capacitive element 110, its capacitance $C_1$ changes. The change in capacitance can lead to production of a current $I_{in}$ associated with the change in capacitance. This can be understood from the following basic relation.

$$C = q/V \quad (1)$$

where q represents the charge stored by the capacitor and V represents a voltage applied across the capacitor. If C varies with time and V is held constant, then the charge q varies with time causing current flow to or from the capacitive element 110.

In FIG. 1, a change in current $I_{in}$ may be sensed by current sensing circuitry 150, which may comprise an operational amplifier 120 and a capacitor $C_2$ coupled between the op-amp's output and inverting input. The non-inverting input may be connected to a reference potential. The current sensing circuit 150 may provide a voltage output $V_{out}$ that is proportional to changes in capacitance of the capacitive element 110. Accordingly, the current sensing circuit 150 may also be referred to as a capacitive sensing circuit herein.

In an ideal capacitive sensing device, all the change in current $I_{in}$ attributable to changes in capacitance of the capacitive element 110 would be received by the current sensing circuit 150. That is, ideally $I_A$ would be the same as $I_{in}$. However, in practice the current sensing circuit 150 is protected from potential damage that may be caused by electrostatic discharge (ESD). In order to protect the circuit, an ESD diode D1 130 is connected between a node common to the capacitive element 110 and the current sensing circuit 150 and a ground (GND) node or reference voltage node as shown in FIG. 1. The ESD diode may or may not be considered to be part of current sensing circuit 150. Unfortunately, the introduction of the ESD diode 130 results in a leakage current $I_{D1}$. Current $I_A$ now becomes $I_{in} - I_{D1}$. Additionally, the leakage current through diode 130 changes with temperature. At room temperature, it may be negligibly small. However, the leakage current $I_{D1}$ can increase to be almost equal to $I_{in}$ at temperatures of around 50 degrees Celcius, leaving only a very small current $I_A$ to be sensed by the current sensing circuit 150. Reduction in the magnitude of current $I_A$ can lead to noise-related errors and poor user-interaction with devices that use such capacitive-sensing elements and circuitry.

SUMMARY

The present invention relates to apparatus and methods for detecting and compensating for leakage currents in capacitive sensing circuitry. The leakage current compensating circuitry comprises active feedback wherein an operational amplifier is used to sense an equivalent leakage current and output a control signal to provide a compensating current approximately equal to the leakage current, according to one embodiment. The inventors have recognized that the compensating circuitry is easily extendable to large scale integration of a plurality of capacitive sensors by adding only one transistor for each additional capacitive sensor.

According to one embodiment, a leakage compensation circuit for a capacitive sensor comprises an amplifier configured to sense a first current through a sense node where the first current is substantially equal to a leakage current in a leakage device connectable to the compensation circuit at a second node. The compensation circuit may further comprise a first output transistor coupled to an output of the amplifier and configured to provide a compensation current approximately equal to the leakage current to the second node responsive to a control signal received from the amplifier. The leakage device may be an electrostatic discharge diode coupled at an input of the capacitive sensing circuit.

In some embodiments, a capacitive sensing circuit comprises a first capacitive sensor coupled to a first node, a first current sensing circuit coupled to the first node, and a first electrostatic discharge device having a first terminal coupled to the first node and a second terminal coupled to a first potential. The capacitive sensing circuit may further comprise an amplifier configured to sense an equivalent current through and equivalent device approximately equal to a leakage current in the first electrostatic discharge device, and a first output transistor coupled to an output of the amplifier and configured to provide a first compensating current approximately equal to the leakage current to the first node responsive to a control signal received from the amplifier.

Also contemplated are methods for compensating leakage currents. In one embodiment, a method for compensating a leakage current in a capacitive sensing circuit comprises acts of sensing, with a leakage compensation circuit, a first current approximately equal to the leakage current that occurs in a leakage device of the capacitive sensing circuit, and supplying, with the leakage compensation circuit, a compensating current approximately equal to the leakage current to a node coupled to the leakage device. The leakage device may be an electrostatic discharge diode coupled at an input of the capacitive sensing circuit.

In some embodiments, a method for compensating a leakage current in a plurality of capacitive sensing circuits comprises acts of sensing, with one leakage compensation circuit, a current approximately equal to a leakage current in a first leakage device, and supplying, with the leakage compensation circuit, a plurality of compensating currents each approximately equal to the leakage current to a plurality of nodes each coupled to a respective leakage device of a respective capacitive sensing circuit.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

The features and advantages of the present invention will become more apparent from the detailed description set forth below when taken in conjunction with the drawings.

DETAILED DESCRIPTION

Figure 1:
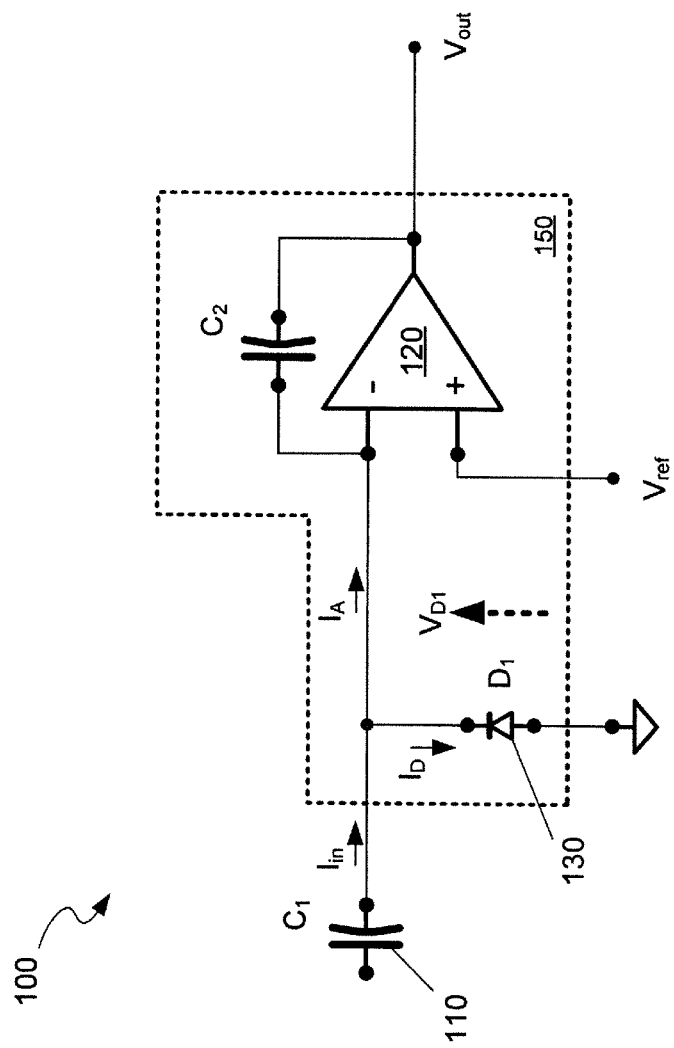
FIG. 1 is a circuit diagram of capacitive sensing circuitry.
Figure 2:
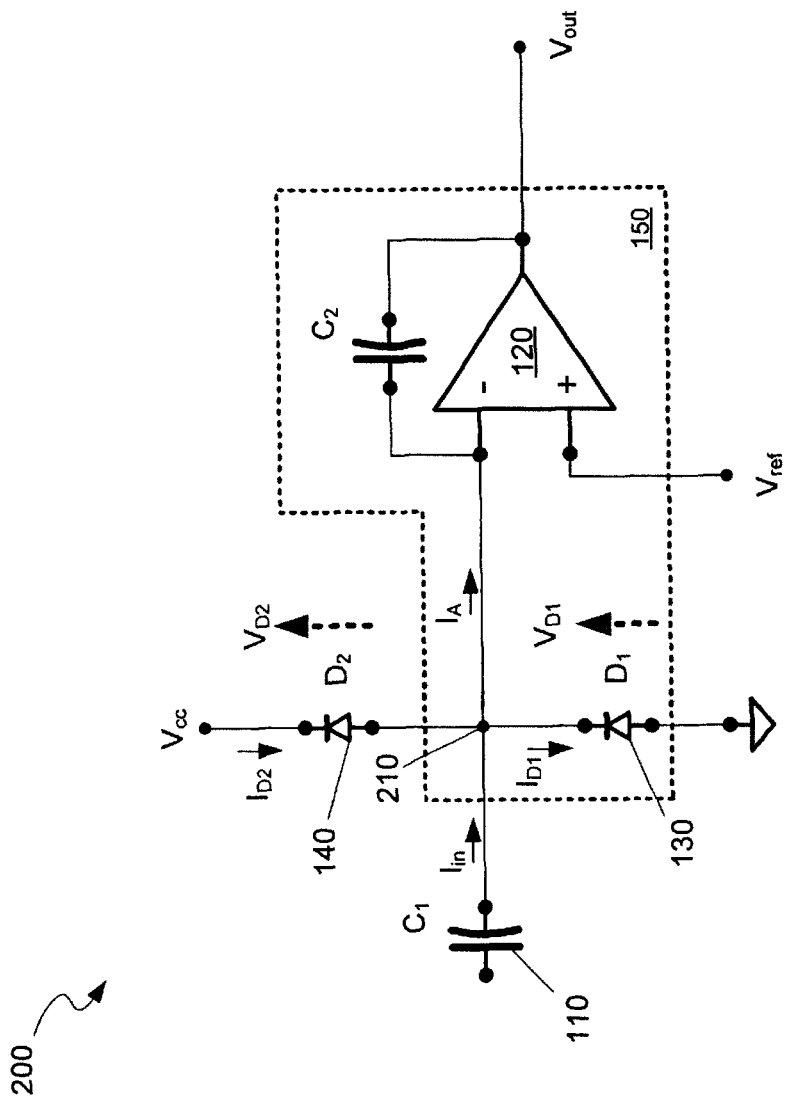
FIG. 2 is an illustration of a capacitive sensing circuit according to one embodiment in which a compensating diode $D_2$ has been added to the circuitry of FIG. 1.

One approach that may be used to compensate for the leakage current $I_{D1}$ in a capacitive sensing circuit is shown in FIG. 2. In this embodiment, an additional ESD diode D2 140 is connected between voltage supply $V_{CC}$ and node 210. Diode D2 may be selected to have substantially the same device specifications as ESD diode D1. $V_{CC}$ is selected such that the voltage ($V_{D2}$) across diode D2 140 is substantially equal to the voltage ($V_{D1}$) across diode D1 130. In this configuration, the leakage current $I_{D2}$ flowing through diode D2 is approximately equal to $I_{D1}$. Current $I_{D2}$ therefore approximately compensates for current $I_{D1}$ at node 210, and the current $I_A$ flowing to the amplifier 120 will be approximately equal to $I_{in}$.

Although the approach shown in FIG. 2 may work for compensating leakage current, there are some disadvantages associated with this approach. Firstly, in practice it may be difficult to maintain $V_{D2}$ approximately equal to $V_{D1}$. Secondly, the size of an ESD diode D2 140 can be large and accordingly will occupy a large layout area in an integrated circuit or a printed circuit board for each sensing circuit. Thirdly, stray capacitance associated with the ESD diode D2 can be large and have an adverse effect on sensitivity of sensor 110 or detectability of the change in the capacitance $C_1$.

Figure 3:
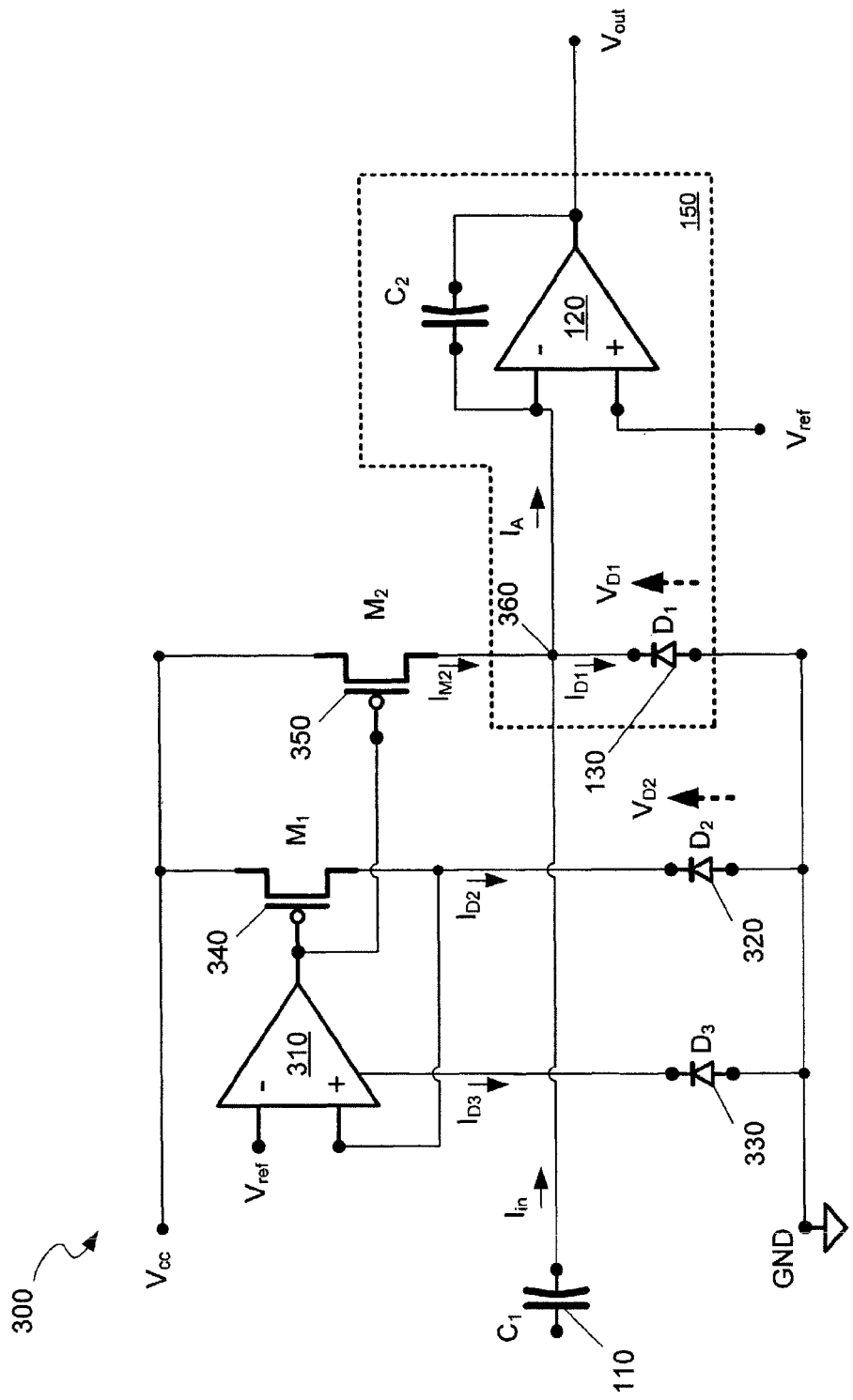
FIG. 3 is an illustration of a capacitive sensing circuit with active leakage current compensation, according to one embodiment.

According to one embodiment, shown in FIG. 3, a circuit 300 for compensating leakage currents in capacitive sensing circuitry may comprise additional circuit elements coupled to an input node of current sensing circuit 150. Though a number of additional circuit elements are used for compensating leakage current, most of these elements may be shared among a plurality of capacitive sensing circuits, as will be appreciated in reference to FIG. 4. The elements used to compensate the leakage current may include an op-amp 310, transistors M1 340 and M2 350, and ESD diodes D2 320 and D3 330. Diode D3 330 may be used to provide a biasing current for the input differential pair of op-amp 310, as will be explained further below.

Op-amp 310 may be configured to receive a reference voltage $V_{ref}$ at a first input terminal. The reference voltage may be of the same value as provided to an input of current sensing circuitry 150. An output of the amplifier may be coupled to a control terminal or gate of a supply transistor M1 340 and to a control terminal of an output transistor M2 350. The transistors M1 and M2 may each have one main current-carrying terminal coupled to a first potential line (e.g., a drain terminal connected to a voltage supply line). Transistor M2 may have a second main terminal coupled to the ESD diode 130. Transistor M1 may have a second main terminal coupled to a device that is equivalent to ESD diode 130 (e.g., an ESD diode 320 having substantially the same specifications as diode 130, or a device exhibiting substantially the same leakage current as diode 130). A bias terminal of op-amp 310 may be coupled to a bias device (e.g., a diode 330 having properties described below). Diodes 130, 320, and 330 may be coupled to a second potential line (e.g., a ground line or reference voltage line).

As an overview of operation of the circuit shown in FIG. 3, transistors M1 and M2 may be configured to operate as a current mirror. Op-amp 310 and diodes D2 and D3 can be configured to sense an amount of current flowing through diode D2 320. When diode D2 is selected to have substantially the same device specifications as diode D1 and the voltages $V_{ref}$ at an input to the current sensing circuitry 150 and op-amp 310 are the same, then the op-amp 310 effectively senses an amount of current $I_{D2}$ flowing through diode D2 that is approximately equal to the leakage current $I_{D1}$ flowing through diode D1. (Note that $V_{D1} \approx V_{ref} \approx V_{D2}$.) Alternatively, op-amp 310 can be considered to maintain a bias of approximately $V_{ref} \approx V_{D1}$ across diode D2. Since the bias across diodes D1 and D2 are substantially the same and the diode specifications are substantially the same, currents $I_{D1}$ and $I_{D2}$ will be substantially the same.

Since M1 and M2 are configured as a current mirror (e.g., M2 has substantially the same device specifications as M1), transistor M2 will supply current $I_{M2}$ that is approximately equal to $I_{D2} \approx I_{D1}$. In this manner, current $I_{M2} \approx I_{D1}$ can substantially compensate for leakage current $I_{D1}$ at node 360. Therefore, current $I_A$ provided to the current sensing circuit 150 is approximately equal to 4, from the capacitive sensor 110.

In practice, $I_{D1}$ can be highly sensitive to temperature and this can lead to instabilities in the circuit shown in FIG. 3. Such instabilities can be avoided by using diode D3 330 to provide a bias current to the input differential pair of op-amp 310. Since diodes D1 and D2 are matched (e.g., have substantially the same device specifications), leakage current $I_{D2} \approx I_{D1}$ can be highly sensitive to temperature variations. For example, $I_{D2}$ may increase for high temperature and decreases for low temperature. The same may be true for current $I_{D3}$ flowing through diode D3. Additionally, the transconductance of transistor M1 340 ($g_{m1}$) is also highly sensitive to temperature. Because of the temperature sensitivity, op-amp 310 may become unstable when $g_{m1}$ is smaller than $g_{m3}$, where $g_{m3}$ is the trans-conductance of the input differential-pair of op-amp 310. This can become particularly problematic at low temperature when $g_{m1}$ is negligibly small.

To mitigate instabilities of the op-amp 310 for any temperature, the biasing current $I_{D3}$ of input differential-pair of op-amp 310 should track $I_{D1}$ in a manner such that $g_{m1}$ is always greater than $g_{m3}$ for any temperature. Maintaining $g_{m1}$ greater than $g_{m3}$ can be achieved in some embodiments by selecting a diode D3 to provide a current $I_{D3}$ that is less than the leakage currents $I_{D2}$ or $I_{D1}$. For example, diode D3 may be selected such that $I_{D3}<I_{D2}$ in some embodiments, or $I_{D3}<0.9I_{D2}$ in some embodiments, or $I_{D3}<0.7I_{D2}$ in some embodiments, or $I_{D3}<0.5I_{D2}$ in some embodiments, or $I_{D3}<0.3I_{D2}$ in some embodiments.

As one example, diode D3 330 may be selected such that $I_{D3}\approx 0.5I_{D2}$. This can assure stability of the op-amp 310, since $g_{m1}\approx 0.5g_{m3}$. It will be appreciated from the circuit of FIG. 3 that $g_{m1}$ and $g_{m3}$ track each other or are correlated, since $I_{D3}$ tracks $I_{D2}$, which in turn tracks $I_{D1}$. Although for this example, diode D3 is selected such that $I_{D3}\approx 0.5I_{D2}$, as noted above diode D3 may be selected such that $I_{D3}$ has any value less than $I_{D2}$, so that $g_{m1}$ is always greater than $g_{m3}$ at any temperature.

As can be appreciated from FIG. 3, compensation circuitry comprising op-amp 310, transistors 340, 350, and devices 320, 330 may be used to compensate for any type of current leakage device that may be substituted for ESD diode 130. If a current leakage device were substituted for ESD diode 130, the device 320 would be replaced with an equivalent device, e.g., a device that exhibits substantially equivalent current leakage characteristics as device 130. Additionally, for circuit stability, device 330 would be replace with a device that provides a current $I_{D3}$ that is less than the leakage currents $I_{D2}$ or $I_{D1}$, as explained above.

For example and with reference to FIG. 3, a leakage compensation circuit for a capacitive sensor, capacitive sensing circuit, or current sensing circuit may comprise an amplifier 310 configured to sense a current through a first node, at which the sensed current is substantially equal to a leakage current in a leakage device 130. The leakage device may be connectable to the leakage compensation circuit at a second node 360. The leakage compensation circuit may further comprise an output transistor 350 coupled to an output of the amplifier 310 and configured to provide a compensation current approximately equal to the leakage current in the leakage device to the second node 360 responsive to a control signal received from the amplifier.

Figure 4:
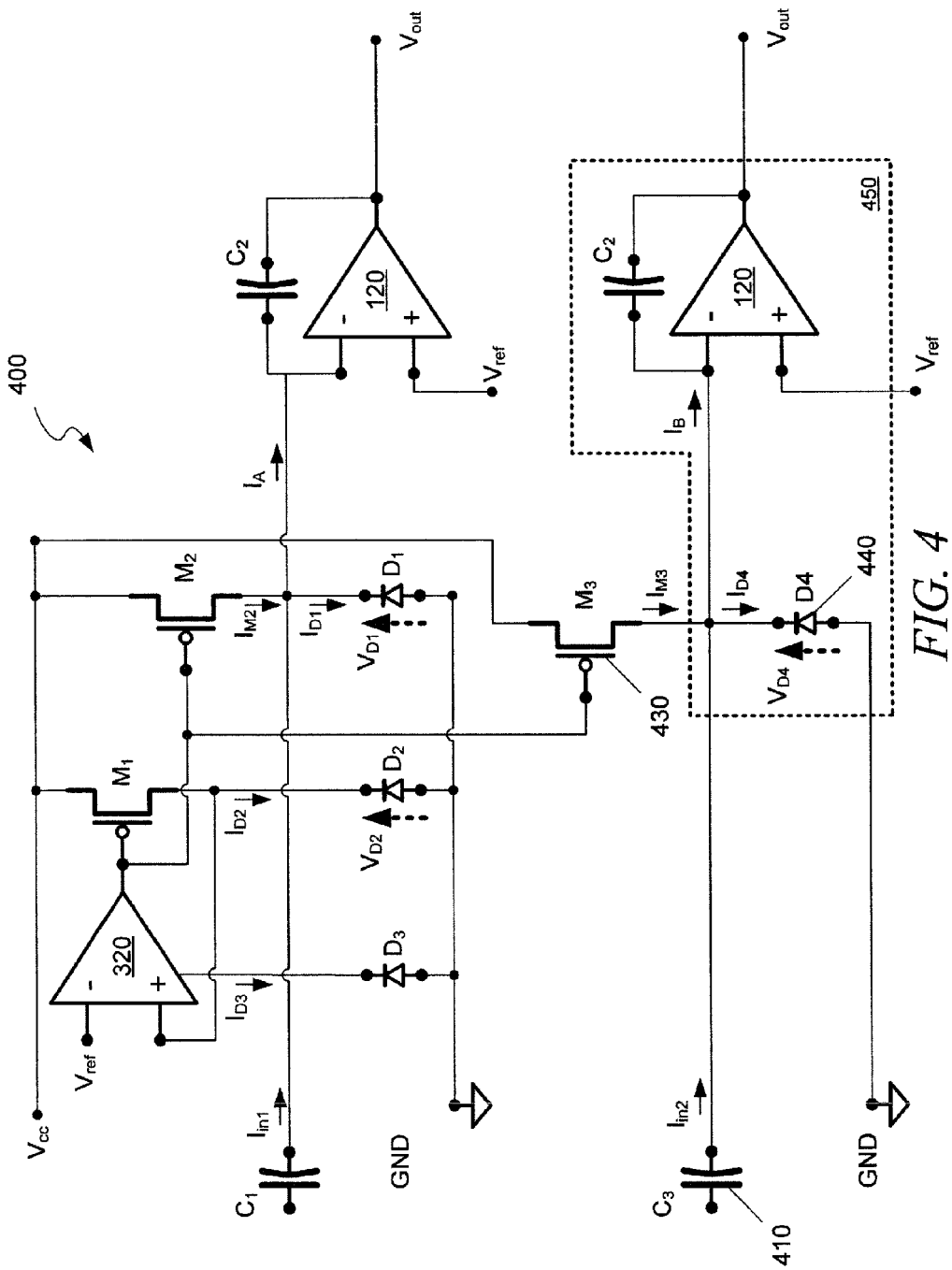
FIG. 4 is an illustration of a capacitive sensing circuit for multiple capacitive elements, according to one embodiment.

As illustrated in FIG. 4, a second capacitive sensor 410 and capacitive sensing circuit 450 has been added to the circuitry depicted in FIG. 3. The device specifications for diode D4 440 may be the same as for diode D1 130, and $V_{ref}$ may be applied to amplifier 120. Transistor M3 430 may be configured in a current mirror relationship with transistor M1. Therefore, $I_{M3}\approx I_{D2}\approx I_{D1}\approx I_{D4}$. The last equality holds when the device specifications for diode D1 and D4 are substantially the same. As can be seen in the diagram of FIG. 4, the second capacitive sensing circuit requires only a single transistor 430 to compensate for leakage current through diode D4.

As may be appreciated from FIG. 4 and the above description, only one transistor need be added to the circuitry of FIG. 4 for each additional capacitive sensor and corresponding capacitive sensing circuit. Accordingly, compensating leakage currents in capacitive sensing circuits according to an embodiment as depicted in FIG. 3 can require fewer total circuit elements for applications requiring a large number of capacitive sensors, e.g., touch-sensitive screens, touch-sensitive capacitive keyboards, tablets, or tracking pads, touch-sensitive operation panels.

It will be appreciated from the embodiments of the compensation circuitry described above that there exists corresponding methods for compensating leakage currents. As one example and with reference to FIG. 3, a method for compensating a leakage current in a capacitive sensing circuit may comprise acts of sensing, with a leakage compensation circuit, a current $I_{D2}$ approximately equal to a leakage current $I_{D1}$ in a leakage device (e.g., an electrostatic discharge device or static dissipative element), and supplying, with the leakage compensation circuit, a current $I_{M2}$ approximately equal to the leakage current $I_{D1}$ to a node coupled to the leakage device. The act of sensing may comprise receiving, at a first input terminal of an amplifier 310, a signal representative of the leakage current in the leakage device. The signal representative of the leakage current may be received from a sense node coupled to an equivalent device 320 that carries an equivalent current approximately equal to the leakage current.

Also contemplated is a method for compensating leakage current in a plurality of capacitive sensing circuits. With reference to FIG. 4, a method for compensating leakage current in a plurality of capacitive sensing circuits may comprise acts of sensing, with one leakage compensation circuit, a current $I_{D2}$ approximately equal to a leakage current $I_{D1}$ in a first leakage device, and supplying, with the leakage compensation circuit, a plurality of currents $I_{M2}$, $I_{M3}$ approximately equal to the leakage current $I_{D1}$, $I_{D4}$ to a plurality of nodes each coupled to a respective leakage device of a respective capacitive sensing circuit.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

For example, though transistors of a first type (PMOS) may have been shown in the drawings, transistors of a second type (NMOS) may be used instead with voltage supplies changed accordingly. In some instances, signal polarities may be reversed or inverted. Also, attenuators, amplifiers, or buffers may be inserted in a signal line. Such modifications may be made to the disclosed circuits without substantially modifying the functionality of the disclosed circuits, and circuits modified accordingly should be considered equivalent to the disclosed circuits.

The indefinite articles "a" and "an," as used herein in the specification and in the claims, unless clearly indicated to the contrary, should be understood to mean "at least one."

The terms "substantially equivalent to" and "approximately equal to" and their equivalents should be understood to mean that a first element is equivalent to or nearly equivalent to a second element. In some embodiments, the degree of equivalence may be within about ±2%, in some embodiments within about ±5%, in some embodiments within about ±10%, and yet in some embodiments within about ±20%.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed is:

1. A leakage compensation circuit, comprising:
   an amplifier configured to sense a first current through a sense node that is substantially equal to a leakage current in a leakage device connectable to the compensation circuit at a second node;
   a supply transistor having a control terminal directly connected to an output of the amplifier, a first main terminal coupled to a first potential and a second main terminal directly connected to both the sense node and a first input terminal of the amplifier; and a first output transistor having a control terminal directly connected to said output of the amplifier and configured to provide a compensation current to the second node in response to a control signal output from said amplifier, wherein the compensation current is approximately equal to the leakage current.

2. The circuit of claim 1, wherein the amplifier is configured to receive at a first input terminal a reference voltage and to receive at a second input terminal a signal representative of the leakage current in the leakage device.

3. The circuit of claim 1, wherein the leakage device comprises an electrostatic discharge device.

4. The circuit of claim 1, wherein the leakage device comprises a reverse-biased diode.

5. The circuit of claim 1, further comprising a bias diode coupled to a bias input of the amplifier and configured to provide an input bias current less than the leakage current to the amplifier.

6. The circuit of claim 1, further comprising an equivalent device coupled between the sense node and a second potential, wherein said equivalent device is equivalent to said leakage device.

7. The circuit of claim 6, wherein the equivalent device exhibits the first current that is approximately equal to the leakage current in the leakage device.

8. The circuit of claim 6, wherein a second input terminal of the amplifier is coupled to a reference voltage.

9. The circuit of claim 6, wherein the first output transistor is configured in a current mirror relationship with the supply transistor.

10. The circuit of claim 6, wherein the leakage device comprises a first diode and the equivalent device comprises a second diode having substantially the same device specifications as the first diode.

11. The circuit of claim 6, further comprising a second output transistor having a control terminal coupled to an output of the amplifier and configured to provide the compensation current to a third node in response to the control signal output from the amplifier.

12. A leakage compensation circuit, comprising:
an amplifier having an input differential pair including a first input terminal, a second input terminal and bias terminal, said amplifier configured to sense a first current at the first input terminal that is substantially equal to a leakage current in a leakage device connectable to the compensation circuit at a second node;
a bias diode coupled between the bias terminal of the amplifier and a supply node and configured to provide an input bias current to the amplifier, said input bias current being less than the leakage current; and
a first output transistor having a control terminal coupled to an output of the amplifier and configured to provide a compensation current to the second node in response to a control signal output from said amplifier, wherein the compensation current is approximately equal to the leakage current.

13. The circuit of claim 12, wherein the amplifier is configured to receive a reference voltage at the second input terminal.

14. The circuit of claim 12, wherein the leakage device comprises an electrostatic discharge device.

15. The circuit of claim 12, wherein the leakage device comprises a reverse-biased diode.

16. The circuit of claim 12, further comprising: a supply transistor having:

a first main terminal coupled to a first potential and a second main terminal coupled to said sense node and a control terminal coupled to the output of the amplifier; and an equivalent device coupled between the sense node and a second potential, wherein said equivalent device is equivalent to said leakage device.

17. The circuit of claim 16, wherein the equivalent device exhibits the first current that is approximately equal to the leakage current in the leakage device.

18. The circuit of claim 16, wherein the first output transistor is configured in a current mirror relationship with the supply transistor.

19. The circuit of claim 16, wherein the leakage device comprises a first diode and the equivalent device comprises a second diode having substantially the same device specifications as the first diode.

20. The circuit of claim 16, further comprising a second output transistor having a control terminal coupled to an output of the amplifier and configured to provide the compensation current to a third node in response to the control signal output from the amplifier.

21. A leakage compensation circuit, comprising:
a first amplifier having an input differential pair including a first input terminal, a second input terminal and bias terminal and further including an output terminal;
a sense node connected to the first input terminal of the first amplifier;
a first transistor having a control terminal coupled to the output terminal of the first amplifier, a first main terminal coupled to a first supply node and a second main terminal connected to the sense node;
a first diode having a cathode connected to the sense node and an anode connected to a second supply node;
a second diode having a cathode connected to the bias terminal and an anode connected to said second supply node; and
a second transistor having a control terminal coupled to the output terminal of the amplifier, a first main terminal coupled to said first supply node and a second main terminal connected to an output node connectable to a leakage device through which a first leakage current flows;
wherein the first diode exhibits a second leakage current which is substantially equal to said first leakage current.

22. The circuit of claim 21, wherein said leakage device comprises a third diode.

23. The circuit of claim 22, wherein said third diode is an electrostatic discharge device.

24. The circuit of claim 21, wherein said leakage device comprises a circuit including:
a third diode having a cathode connected to the output node and an anode connected to said second supply node;
a second amplifier having a first input terminal coupled to the output node and an amplifier output node; and
a capacitor coupled between the amplifier output node and the first input terminal of the second amplifier.

25. The circuit of claim 24, wherein the second input terminal of the first amplifier is coupled to receive a reference voltage, and wherein a second input terminal of the second amplifier is coupled to receive the same reference voltage.

26. The circuit of claim 21, wherein the first amplifier operates to sense said second leakage current flowing through the first diode and further control operation of the second transistor to generate an equivalent source current for supply to said output node in compensating for said first leakage current flowing through said leakage device.

27. The circuit of claim 21, wherein the first diode is an equivalent of said leakage device.

28. The circuit of claim 21, wherein a bias current in said second diode is less than the second leakage current in the first diode.

\* \* \* \* \*